US012564078B2

(12) United States Patent
Lee et al.

(10) Patent No.: US 12,564,078 B2
(45) Date of Patent: *Feb. 24, 2026

(54) ELECTRONIC PACKAGE

(71) Applicant: Advanced Semiconductor Engineering, Inc., Kaohsiung (TW)

(72) Inventors: Pao-Nan Lee, Kaohsiung (TW); Chen-Chao Wang, Kaohsiung (TW); Chang Chi Lee, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 632 days.

This patent is subject to a terminal disclaimer.

(21) Appl. No.: 17/669,231

(22) Filed: Feb. 10, 2022

(65) Prior Publication Data

US 2023/0253302 A1 Aug. 10, 2023

(51) Int. Cl.
 *H01L 23/498* (2006.01)
 *H01L 25/16* (2023.01)

(52) U.S. Cl.
 CPC ........ *H01L 23/49838* (2013.01); *H01L 25/16* (2013.01)

(58) Field of Classification Search
 CPC .............. H01L 24/34; H01L 23/49838; H01L 23/5286; H01L 23/50; H01L 23/5389; H01L 23/49816; H01L 25/16; H01L 25/105; H01L 25/0652; H01L 25/18;

H01L 2225/06513; H01L 2225/06517; H01L 2225/06541; H01L 2225/06548; H01L 2225/1023; H01L 2225/1058; H01L 2224/34
See application file for complete search history.

(56) References Cited

U.S. PATENT DOCUMENTS

| | | | |
|---|---|---|---|
| 10,748,870 B2 | 8/2020 | Yu et al. | |
| 11,844,199 B2 * | 12/2023 | Hung ................... | H05K 1/0216 |
| 2002/0057554 A1 * | 5/2002 | Dibene, II .............. | G06F 1/182 |
| | | | 361/720 |
| 2008/0142961 A1 * | 6/2008 | Jones .................... | H01L 25/165 |
| | | | 257/E23.085 |
| 2012/0112352 A1 | 5/2012 | Chi et al. | |
| 2013/0003310 A1 | 1/2013 | Raj et al. | |
| 2014/0063744 A1 * | 3/2014 | Lopez .................... | H01L 24/41 |
| | | | 361/783 |

(Continued)

OTHER PUBLICATIONS

Notice of Allowance on U.S. Appl. No. 17/865,380 Dtd Sep. 19, 2024.

*Primary Examiner* — Teresa M. Arroyo
(74) *Attorney, Agent, or Firm* — FOLEY & LARDNER LLP

(57) ABSTRACT

An electronic package is disclosed. The electronic package includes an electronic component and a plurality of power regulating components. The plurality of power regulating components includes a first power regulating component and a second power regulating component. A first power path is established from the first power regulating component to a backside surface of the electronic component. A second power path is established from the second power regulating component to the backside surface of the electronic component.

20 Claims, 7 Drawing Sheets

100A

(56)  References Cited

U.S. PATENT DOCUMENTS

| | | | |
|---|---|---|---|
| 2015/0271913 A1* | 9/2015 | Stepniak | H05K 1/185 |
| | | | 361/761 |
| 2016/0093588 A1* | 3/2016 | Wang | H01L 24/18 |
| | | | 257/737 |
| 2016/0190113 A1* | 6/2016 | Sharan | H01L 23/5223 |
| | | | 257/532 |
| 2016/0372449 A1* | 12/2016 | Rusu | H10D 1/68 |
| 2019/0206827 A1* | 7/2019 | Eskandar | H01L 25/0655 |
| 2020/0006293 A1* | 1/2020 | Sankman | H01L 24/16 |
| 2020/0105653 A1* | 4/2020 | Elsherbini | H01L 23/645 |
| 2020/0312773 A1* | 10/2020 | Tsai | H01L 21/6835 |
| 2020/0381392 A1* | 12/2020 | Yu | H10B 63/84 |
| 2021/0057367 A1* | 2/2021 | Signorini | H01L 24/20 |
| 2021/0120675 A1 | 4/2021 | Clavette | |
| 2021/0151374 A1 | 5/2021 | Zou et al. | |
| 2021/0175189 A1* | 6/2021 | Kung | H01L 21/6835 |
| 2021/0280523 A1* | 9/2021 | We | H01L 21/4853 |
| 2022/0020665 A1* | 1/2022 | Li | H01L 25/16 |
| 2022/0028848 A1 | 1/2022 | Baek | |
| 2022/0077109 A1 | 3/2022 | Chava et al. | |
| 2023/0140057 A1 | 5/2023 | Samarthyam et al. | |
| 2023/0253305 A1* | 8/2023 | Kuo | H01L 23/49833 |
| | | | 257/691 |
| 2023/0274998 A1* | 8/2023 | Pan | H01L 25/0657 |
| | | | 257/668 |
| 2023/0299044 A1* | 9/2023 | Collins | H01L 23/642 |
| | | | 257/659 |
| 2025/0054877 A1* | 2/2025 | Lee | H10D 1/20 |

* cited by examiner

300

ELECTRONIC PACKAGE

BACKGROUND

1. Field of the Disclosure

The present disclosure relates to an electronic package, and in particular to an electronic package having an electronic component and a power regulating component.

2. Description of the Related Art

System-in-Package (SiP) technology leverages integrated circuit (IC) assembly capabilities, including wafer level packaging, fan-out wafer level packaging, 2.5D/3D IC, etc., to integrate multiple chips or components into a package. Since different voltages should be provided for components in a package having different functions, a power regulating component may be used to provide different types of power control.

The power routing path for the power regulating component is usually provided by a substrate and/or package routing features (such as conductive vias and pads) in the package. A long power routing path through the substrate may cause a significant voltage drop and degrade the performance thereof. When the swing of input/output voltage is further constrained in ever-shrinking semiconductor technology, the voltage drops of the power may become an issue.

SUMMARY

In some embodiments, an electronic package includes an electronic component and a plurality of power regulating components. The plurality of power regulating components include a first power regulating component and a second power regulating component. A first power path is established from the first power regulating component to a backside surface of the electronic component. A second power path is established from the second power regulating component to the backside surface of the electronic component.

In some embodiments, an electronic package includes a power regulating component, a memory device, and an electronic component. The memory device is disposed above the power regulating component. The electronic component is disposed between the power regulating component and the memory device. A power path is established between the power regulating component and the electronic component and passes through a backside surface of the electronic component.

In some embodiments, an electronic package includes an electronic component and a plurality of power regulating components. The plurality of power regulating components include a first power regulating component and a second power regulating component. Each of the first power regulating components and the second power regulating components at least partially overlaps the electronic component from a top view.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
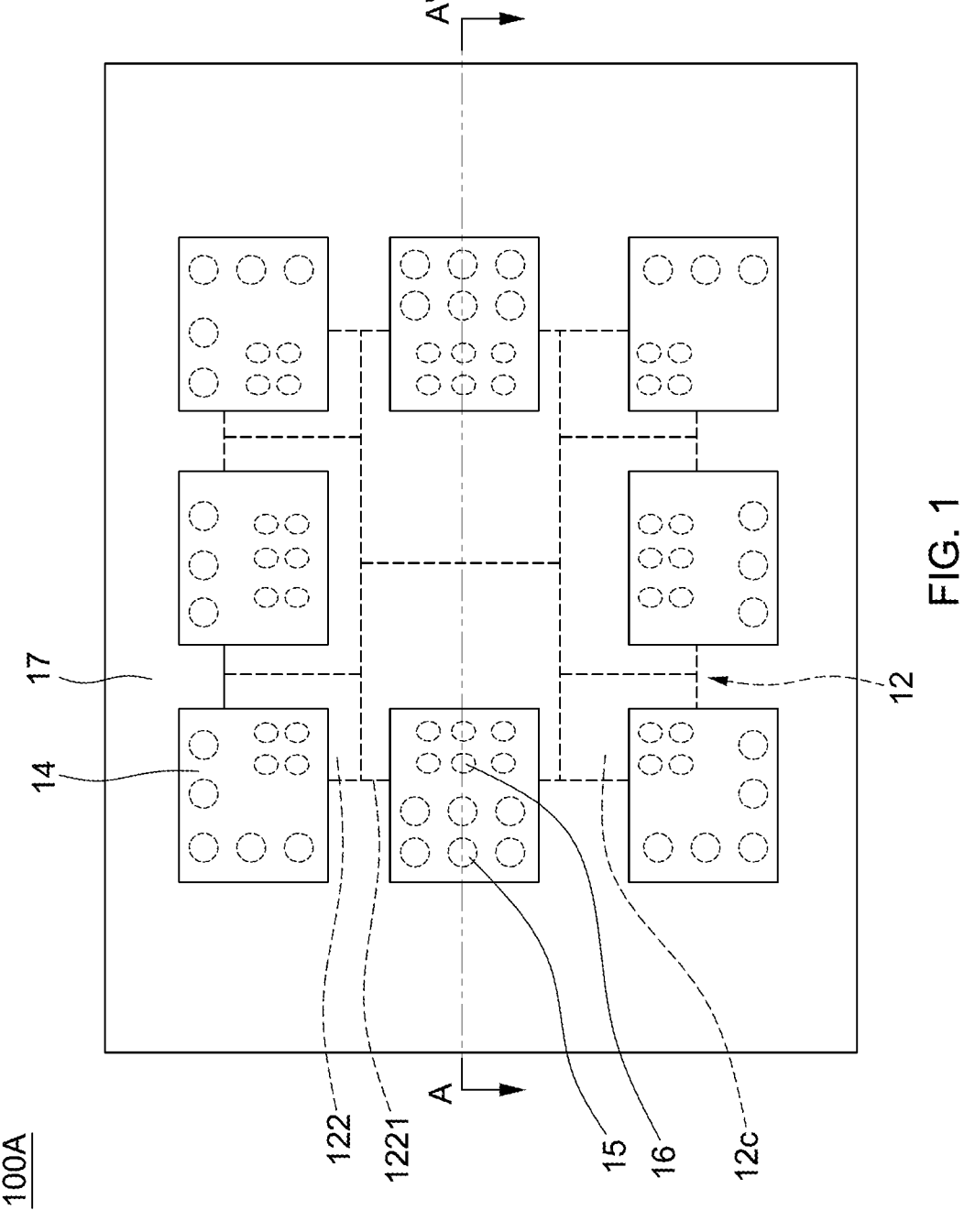
FIG. 1 illustrates a top view of an example of an electronic package according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2:
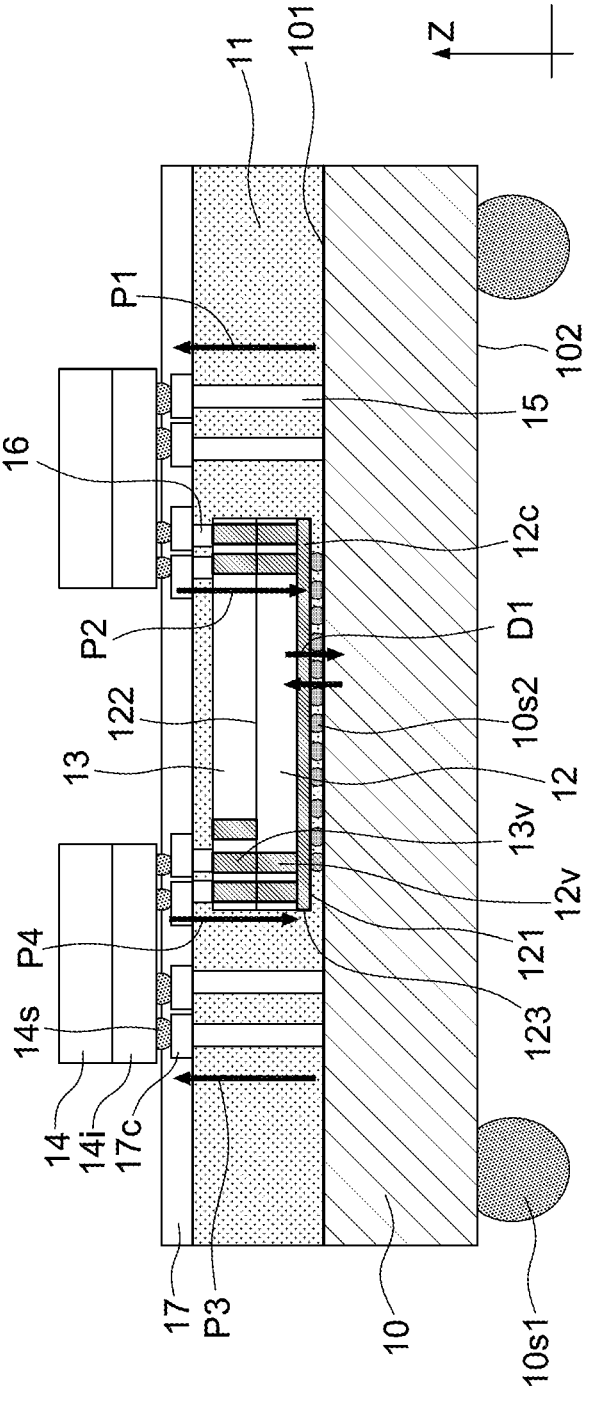
FIG. 2 illustrates a cross-sectional view along the line A-A' of the electronic package of FIG. 1 according to some embodiments of the present disclosure.

FIG. 1 illustrates a top view of an example of an electronic package 100A according to some embodiments of the present disclosure. FIG. 2 illustrates a cross-sectional view along the line A-A' of the electronic package 100A of FIG. 1 according to some embodiments of the present disclosure. In some embodiments, the electronic package 100A may include a package, such as a semiconductor device package. As shown in FIG. 2, the electronic package 100A may include a carrier 10, an encapsulant 11, an electronic component 12, a passive device 13, and a plurality of power regulating components 14, a plurality of conductive elements 15, a plurality of conductive elements 16, and a redistribution layer (RDL) 17.

In some embodiments, the carrier 10 may include, for example, a printed circuit board (PCB), such as a paper-based copper foil laminate, a composite copper foil laminate, or a polymer-impregnated glass-fiber-based copper foil laminate. In some embodiments, the carrier 10 may include a semiconductor substrate including silicon, germanium, or other suitable materials. In some embodiments, the carrier 10 may include a redistribution layer (RDL) (not shown) disposed within or on the carrier 10. The RDL of the carrier 10 may provide a fan-out horizontal electrical path for the carrier 10.

The carrier 10 may include a surface 101 and a surface 102 opposite to the surface 101. The carrier 10 may include one or more conductive pads (not shown) in proximity to, adjacent to, or embedded in and exposed from the surface 101 and/or 102 of the carrier 10. The carrier 10 may include a solder bump 10s1 on the surface 102 of the carrier 10 for electrical connections with an external device. The carrier 10 may include a solder bump 10s2 on the surface 101 of the carrier 10 for electrical connections, including, for example, the power routing path (or the power path) and the signal routing path (or the signal path) in the electronic package 1.

In some embodiments, the carrier 10 may provide power and/or ground connections to the devices or components electrically connected with the carrier 10. For example, the carrier 10 may have a connector or terminal configured to be electrically connected with a power source or a power supply (not illustrated in the figures).

In some embodiments, the electronic component 12 may be disposed on the surface 101 of the carrier 10. The electronic component 12 may be surrounded by the encapsulant 11. The electronic component 12 may be electrically connected with the carrier through, for example, the solder resist 10s2. The electronic component 12 may be circuits or circuit elements that rely on an external power supply to control or modify electrical signals. For example, the electronic component 12 may include a processor, a controller, a memory, or an input/output (I/O) buffer, etc. In some embodiments, the electronic component 12 may include, for example, a central processing unit (CPU), a microprocessor unit (MPU), a graphics processing unit (GPU), a microcontroller unit (MCU), an application-specific integrated circuit (ASIC), a field-programmable gate array (FPGA), or another type of integrated circuit.

In some embodiments, the electronic component 12 may have a surface 121 facing the carrier 10 and a surface 122 opposite to the surface 121. The surface 122 may face away from the carrier 10. In some embodiments, the surface 121 may include an active surface and the surface 122 may include a backside surface or a passive surface. In some embodiments, the active surface (e.g., the surface 121) of the electronic component 12 may be closer to the carrier 10 than to the power regulating components 14. In some embodiments, an electrical signal may be transmitted through the active surface (e.g., the surface 121). For example, a data signal path may pass through the active surface (e.g., the surface 121).

The electronic component 12 may include a plurality of circuit regions 12c in the active surface (e.g., the surface 121) or adjacent to the active surface (e.g., the surface 121). Furthermore, the circuit regions 12c of the electronic component 12 may be closer to the carrier 10 than to the power regulating components 14. The circuit regions 12c may be configured to transmit one or more data signals to the carrier 10 and/or to receive one or more data signals from the carrier 10. The arrow of the denotation "D1" shown in FIG. 2 indicates a data signal path. In some embodiments, one or more data signals may be transmitted to the carrier 10 through the data signal path D1. In some embodiments, the signal path D1 may be configured to provide one or more data signals from the electronic component 12 to the carrier

10. In some embodiments, one or more data signals may be free from passing through the power regulating components 14.

As used herein, a data signal path may refer to a path through which an electrical signal may be transmitted. Such an electrical signal may include either analog or digital signals. Additionally, a power path, as used and described herein, may refer to a path dedicated to power supply connections.

As shown in FIG. 1, the plurality of circuit regions 12c may be arranged in a configuration, in which one of the circuit regions 12c partially overlaps the corresponding one of the power regulating components 14. Each of the plurality of circuit regions 12c may be powered by the corresponding one of the power regulating components 14. The positions and number of the circuit regions of the electronic component in the electronic package 100A are not intended to limit the present disclosure. For example, there may be any number of the circuit regions of the electronic component in the electronic package 100A due to design requirements.

In some embodiments, the electronic component 12 may include a conductive via 12V. In some embodiments, the conductive via 12V may extend between the surface 121 and the surface 122. In some embodiments, the conductive via 12V may be electrically connected to the circuit regions 12c. The conductive via 12V may provide electrical connections between the electronic component 12 and the power regulating components 14. The conductive via 12v may be configured to receive powers from the power regulating components 14.

The position and number of the electronic components in the electronic package 100A are not intended to limit the present disclosure. For example, there may be any number of electronic components in the electronic package 100A due to design requirements.

The passive device 13 may be disposed on the surface 122 of the electronic component 12. The passive device 13 may be surrounded by the encapsulant 11. In some embodiments, the passive device 13 may be electrically connected with the electronic component 12. The passive device 13 may be electrically connected with the power regulating components 14. The passive device 13 may include a conductive via 13v extending through the passive device 13. The conductive via 13v may be electrically connected with the conductive via 12v of the electronic component 12.

In some embodiments, the passive device 13 may include a capacitor. The passive device 13 may include a deep trench capacitor (DTC), a multi-layer ceramic capacitor (MLCC) or other capacitors. Other passive devices may be included along with the passive device 13. Alternatively, or additionally, the capacitance 13 may be a discrete component disposed on the carrier 10.

The power regulating components 14 may be disposed adjacent to the electronic component 12. The power regulating components 14 may be disposed on the backside surface or the passive surface (e.g., the surface 122) of the active 12. Each of the power regulating components 14 may partially overlap the electronic component (12) from a top view. Each of the power regulating components 14 may partially overlap the backside surface 122 of the electronic component 12 in a direction Z substantially perpendicular to the surface 101 of the carrier 10 on which the electronic component 12 is disposed. For example, a projection area of one of the power regulating components 14 on the surface 101 of the carrier 10 and a projection area of the electronic component 12 on the surface 101 of the carrier 10 may be partially overlapping. In some embodiments, the power regulating components 14 may extend over and beyond the surface 123 of the electronic component 12.

As shown in FIG. 1, the plurality of power regulating components 14 may be arranged along a perimeter 1221 of the electronic component 12 from a top view. The perimeter 1221 of the electronic component 12 may include one or more edges. The power regulating components 14 may be disposed around one or more edges of the perimeter 1221 of the electronic component 12 from a top view. The power regulating components 14 may be disposed over the encapsulant 11. The power regulating components 14 may extend over and beyond the edges of the perimeter 1221 of the electronic component 12. In other words, a portion of one of the power regulating components 14 may protrude from the edges of the perimeter 1221 of the electronic component 12. For example, the power regulating components 14 may have an overhang structure extending from the electronic component 12.

In some embodiments, the power regulating components 14 may each include a power management integrated circuit (PMIC). The power regulating components 14 may be configured to provide different sorts of power control to different parts of the electronic package 100A. In some embodiments, the power regulating components 14 may each include a voltage regulator, such as a linear regulator (which is configured to maintain a constant output voltage) or a switching regulator (which is configured to generate an output voltage higher than or lower than the input voltage). In some embodiments, the power regulating components 14 may each include a step-down (buck) converter, a step-up (boost) converter, an analog-to-digital converter, a digital-to-analog converter, an AC-DC converter, a DC-DC converter, other types of converters, or a combination thereof.

It is to be noted that the positions and number of power regulating components 14 in the electronic package 100A are not intended to limit the present disclosure. For example, there may be any number of power regulating components 14 in the electronic package 100A due to design requirements.

The power regulating components 14 may each include an inductor device 14i. The inductor device 14i may be disposed between one of the power regulating components 14 and the encapsulant 11. The power regulating components 14 may each include a plurality of solder bump 14s disposed on the inductor device 14i. The solder bump 14s may be electrically connected with the inductor device 14i. The solder bump 14s may be electrically connected with the electronic component 12 and/or the passive device 13. The inductor device 14i and the passive device 13 may be present in the power paths between the power regulating components 14 and the electronic component 12. The inductor device 14i and the passive device 13 may function with the power regulating components 14 to stabilize powers. For example, the inductor device 14i and the passive device 13 may be configured to filter the noise from the powers. The inductor device 14i and the passive device 13 may be configured to remove alternating-current (AC) components from the powers. As such, the power regulating components 14 may be configured to provide stable powers (e.g., direct-current (DC) powers) with the assistance of the inductor device 14i and the passive device 13.

In some embodiments, the power regulating component 14 may further include a resistive device. The resistive device of the power regulating component 14 may be electrically connected to the passive device 13. In some embodiments, the inductor device 14i may include the resistive device. The inductor device 14i, the resistive device, and the passive device 13 may function with the power regulating components 14 to stabilize powers. In some embodiments, the electronic package 100A may include an inductance device (similar to the inductor device 14i) and/or a resistive device electrically connected to the passive device 13.

The plurality of conductive elements 15 may be disposed on the surface 101 of the carrier 10. The conductive elements 15 may be spaced apart from the electronic component 12. In some embodiments, the conductive elements 15 may be disposed adjacent to the surface 123 of the electronic component 12. In some embodiments, the surface 123 of the electronic component 12 may face the conductive elements 15. As shown in FIG. 1, the conductive elements 15 may surround the edges 1221 of the backside surface 122 of the electronic component 12.

In some embodiments, the conductive elements 15 may include conductive materials, such as copper (Cu), tin (Sn), aluminum (Al), gold (Au), silver (Ag), tungsten (W), nickel (Ni), or other suitable materials. In some embodiments, the conductive elements 15 may include a conductive via or a conductive pillar penetrating through the encapsulant 11. For example, the conductive elements 15 may be surrounded or partially covered by the encapsulant 11. In some embodiments, the encapsulant 11 may be configured to support and protect the conductive elements 15.

The plurality of conductive elements 16 may be disposed on the passive device 13. The plurality of conductive elements 16 may be disposed on and connected to the backside surface 122 of the electronic component 12. The conductive elements 16 may be spaced apart from the conductive elements 15. As shown in FIG. 1, a diameter of the conductive element 15 may be greater than a diameter of the conductive element 16. As shown in FIG. 2, a height of the conductive elements 15 may be greater than that of the conductive elements 16.

In some embodiments, the conductive elements 16 may include conductive materials, such as copper (Cu), tin (Sn), aluminum (Al), gold (Au), silver (Ag), tungsten (W), nickel (Ni), or other suitable materials. In some embodiments, the conductive elements 16 may include a conductive via or a conductive pillar. For example, the conductive elements 16 may be surrounded or partially covered by the encapsulant 11. In some embodiments, the encapsulant 11 may be configured to support and protect the conductive elements 16.

As shown in FIGS. 1 and 2, the power regulating components 14 may be disposed on the electronic component 12 and the conductive elements 15. For example, the power regulating components 14 may be supported by the electronic component 12 and the conductive elements 15. For example, the power regulating components 14 may be disposed partially over the electronic component 12 and partially over the conductive elements 15. In some embodiments, the power regulating components 14 may be electrically connected with the electronic component 12 and/or the conductive elements 15.

In some embodiments, the power regulating components 14 may be electrically connected with the carrier 10 through the conductive elements 15. In some embodiments, the power regulating components 14 may be configured to receive an input power from the carrier 10 through the conductive elements 15 and solder bumps 14s. As shown in FIG. 2, the power regulating components 14 may include a first power regulating component (e.g., the right power regulating component 14) and a second power regulating component (e.g., the left power regulating component 14).

The right power regulating component 14 may be configured to receive an input power from the carrier 10. A power path P1 may extend outside the electronic component 12 and to the right power regulating component 14 along the right lateral surface 123 of the electronic component 12. The arrow of the denotation "P1" shown in FIG. 2 indicates an input power path established among the carrier 10, the conductive elements 15, and the right power regulating component 14. In some embodiments, a portion of the power path P1 may be established through one or more of the conductive elements 15. The left power regulating component 14 may be configured to receive an input power from the carrier 10. A power path P3 may extend outside the electronic component 12 and to the left power regulating component 14 along the left lateral surface 123 of the electronic component 12. The arrow of the denotation "P3" shown in FIG. 2 indicates an input power path established among the carrier 10, the conductive elements 15, and the right power regulating component 14.

In some embodiments, the carrier 10 may include a circuit region configured to transmit a data signal to the electronic component 12 and/or receive a data signal from the electronic component 12 through the data signal path D1. In some embodiments, the carrier 10 may include another circuit region configured to provide a power to the electronic component 12 through the power paths P1 and P3.

In some embodiments, the supply power (from a power supply to the carrier 10) may be transmitted to the right power regulating component 14 through the input power path P1 as an input power. The input power path P1 may transmit an input power from the carrier 10 to the right power regulating component 14. In some embodiments, the supply power (from a power supply to the carrier 10) may be transmitted to the left power regulating component 14 through the input power path P3 as an input power. The input power path P3 may be configured to transmit an input power from the carrier 10 to the left power regulating component 14.

In some embodiments, the input power path P1 or P3 may extend along the surface 123 of the electronic component 12. In some embodiments, the input power path P1 or P3 may not pass through the electronic component 12. In some embodiments, the input power path P1 or P3 may be spaced apart from the electronic component 12. In some embodiments, the input power path P1 or P3 may be outside of the electronic component 12. In some embodiments, the input power path P1 or P3 may be free from passing the electronic component 12. In some embodiments, the input power may be free from passing the electronic component 12. In some embodiments, each of the power regulating components 14 may receive an input power through a corresponding input power path. The corresponding input power path refers to an input power path in one or more of the conductive elements 16 electrically connected to one of the power regulating components 14, which overlaps these conductive elements.

In some embodiments, the power regulating components 14 may be electrically connected with the electronic component 12 through the conductive elements 16, the conductive via 13v, and the conductive via 12v. In some embodiments, the right power regulating component 14 may be configured to provide an output power to the electronic component 12 (e.g., one of the circuit regions 12c) through the backside surface (e.g., the surface 122). A power path P2 may be established from the right power regulating component 14 to the backside surface 122 of the electronic component 12. Furthermore, the power path P2 may pass through the backside surface 122 of the electronic component 12. The arrow of the denotation "P2" shown in FIG. 2 indicates an output power path established among the right power regulating component 14, the conductive elements 16, the conductive via 13V of the passive device 13, and the conductive via 12V, and the circuit region 12c of the electronic component 12. In some embodiments, a portion of the power path P2 may pass through the passive device 13. In some embodiments, a portion of the power path P3 may be through the conductive element 16. The left power regulating component 14 may be configured to provide an output power to the electronic component 12 (e.g., one of the circuit regions 12c) through the backside surface (e.g., the surface 122). A power path P4 may be established from the left power regulating component 14 to the backside surface 122 of the electronic component 12. Furthermore, the power path P4 may pass through the backside surface 122 of the electronic component 12. The arrow of the denotation "P4" shown in FIG. 2 indicates an output power path established among the left power regulating component 14, the conductive elements 16, the conductive via 13V of the passive device 13, and the conductive via 12V, and the circuit region 12c of the electronic component 12. In some embodiments, a portion of the power path P4 may pass through the passive device 13.

In some embodiments, the output power from the right power regulating component 14 may be transmitted to the electronic component 12 through the output power path P2. In some embodiments, the output power path P2 may be configured to transmit an output power from the right power regulating component 14 to the electronic component 12. In some embodiments, the output power from the left power regulating component 14 may be transmitted to the electronic component 12 through the output power path P4. In some embodiments, the output power path P4 may be configured to transmit an output power from the left power regulating component 14 to the electronic component 12. The power paths P2 and P4 may be configured to transmit different powers. In some embodiments, each of the power regulating components 14 may provide an output power through a corresponding output power path. The corresponding output power path refers to an output power path in one or more of the conductive elements 15 electrically connected to one of the power regulating components 14, which overlaps these conductive elements.

Referring to the input power paths P1 and P3 as well as the output power paths P2 and P4, the power regulating components 14 may be configured to receive a first plurality of powers (or input powers) from the carrier 10 along the lateral surface 123 of the electronic component 12 without passing the electronic component 12. The power regulating components 14 may be configured to provide a second plurality of powers (or output powers) to the electronic component 12, or, for example, to different circuit regions 12c of the electronic component 12.

In some embodiments, the second plurality of powers may be different from the first plurality of powers. In some embodiments, the second plurality of powers may be regulated by the power regulating components 14 in response to the first plurality of powers. In some embodiments, where the power regulating components 14 include a step-down (buck) converter, the voltage of the second plurality of powers may be less than the voltage of the first plurality of powers. In some embodiments, where the power regulating components 14 include a step-up (boost) converter, the voltage of the second plurality of powers may be larger than the voltage of the first plurality of powers. In some embodiments, where the power regulating components 14 include a linear regulator, the variation of the voltage of the second plurality of powers may be less than the variation of the voltage of the first plurality of powers.

In some embodiments, the electronic component 12 may be configured to transmit one or more data signals to the carrier 10 and/or to receive one or more data signals from the carrier 10 through the active surface (e.g., the surface 121). In some embodiments, the electronic component 12 may be configured to receive an output power from one of the power regulating components 14 through the backside surface (e.g., the surface 122).

According to some embodiments of the present disclosure, by stacking the power regulating components 14 on the electronic component 12, the power path can be shorter than if mounting the power regulating components 14 on the surfaces 101 and/or 102 of the carrier 10. In other words, the total resistance of the wiring in the power path can be smaller. Therefore, the voltage drop in the power path (e.g., the power paths P1 and P3) can be significantly lower than that in the power path for any power regulating component which is mounted on the surfaces 101 and/or 102 of the carrier 10. In addition, no additional pin on the carrier 10 is needed. Furthermore, heat dissipation efficiency may be enhanced.

In addition, by using the input power path P1 outside of the electronic component 12, the input power can be transmitted from the carrier 10 to the power regulating components 14 without consuming input/output (I/O) pins on the surface 121 of the electronic component 12, and thus more I/O pins can be used to transmit data signals. Therefore, the performance of the electronic package 100A can be enhanced.

In some comparative embodiments, a single power regulating component disposed on the backside of an electronic component may be configured to provide powers to the active surface. However, the electronic component may include a plurality of circuit regions which require different powers depending on their specific functions. The single power regulating component may be adjacent to one of the circuit regions, referred to as a proximal circuit region. Certainly, the voltage drop in the power path between the single power regulating component and the proximal circuit region may be reduced, while the power paths between circuit regions other than the proximal circuit region and the single power regulating component may be longer than that for the proximal circuit region. Thus, the extent of the voltage drop in each power path is different. For example, some circuit region which is farther away from the single power regulating component would have longer power path, indicating a higher total resistance therein. The voltage drop thereof would increase. Hence, the effect of reducing the voltage drop in every power path between the circuit regions and the single power regulating component may be suppressed.

In the present disclosure, a plurality of power regulating components 14 are disposed on the backside surface 122 of the electronic component 12. Each of the power regulating components 14 may partially overlap at least one of the circuit regions 12c of the electronic component 12 in the direction Z. Each of the power regulating components 14 may be configured to serve the most proximal one of the circuit regions 12c of the electronic component 12. Therefore, the power paths (e.g., the power paths P2 and P4) between the circuit regions 12c of the electronic component 12 and the power regulating components 14 may be optimized by being shortened. As such, the voltage drop of each power path (e.g., the power paths P2 and P4) can be significantly reduced. In some embodiments, the lengths of the power paths P2 and P4 are substantially the same. The variation of the voltage drop of power paths (e.g., the power paths P2 and P4) can be significantly reduced.

Each of the power regulating components 14 may include a conductive pad (not shown) facing the backside surface 122 of the electronic component 12 and configured to provide powers to the corresponding terminals adjacent to the backside surface 122 of the electronic component 12. Each of the power paths P2 and P4 may be established between the conductive pad of each of the power regulating components 14 and one of the corresponding terminals of the electronic component 12. The directions of the power paths P2 and P4 may be substantially perpendicular to the surface 101 of the carrier 10 on which the electronic component 12 is disposed.

Furthermore, the second plurality of powers provided by the power regulating components 14 may be different depending on the required power of the circuit regions 12c of the electronic component 12. Each of the second powers may correspond to the required power of at least one of the circuit regions 12c of the electronic component 12.

Referring again to FIG. 2, the RDL 17 may be disposed on the encapsulant 11. The RDL 17 may be disposed between the power regulating components 14 and the encapsulant 11. The RDL 17 may be disposed over the passive device 13 or the electronic component 12. In some embodiments, the RDL 17 may each include an interposer. In some embodiments, the RDL 17 may each include, for example, a printed circuit board, such as a paper-based copper foil laminate, a composite copper foil laminate, or a polymer-impregnated glass-fiber-based copper foil laminate. The RDL 17 may each include, for example, silicon (Si), glass or other suitable materials.

The RDL 17 may include a plurality of circuit layers 17c. The circuit layers 17c may be in contact with the solder bumps 14s. The circuit layers 17c may be in contact with the conductive elements 15. The circuit layers 17c may be in contact with the conductive via 13v of the passive device 13. One or more of circuit layers 17c may electrically connect the conductive elements 15 to the power regulating components 14. One or more circuit layers 17c may electrically connect the conductive elements 16 to the power regulating components 14.

Figure 3:
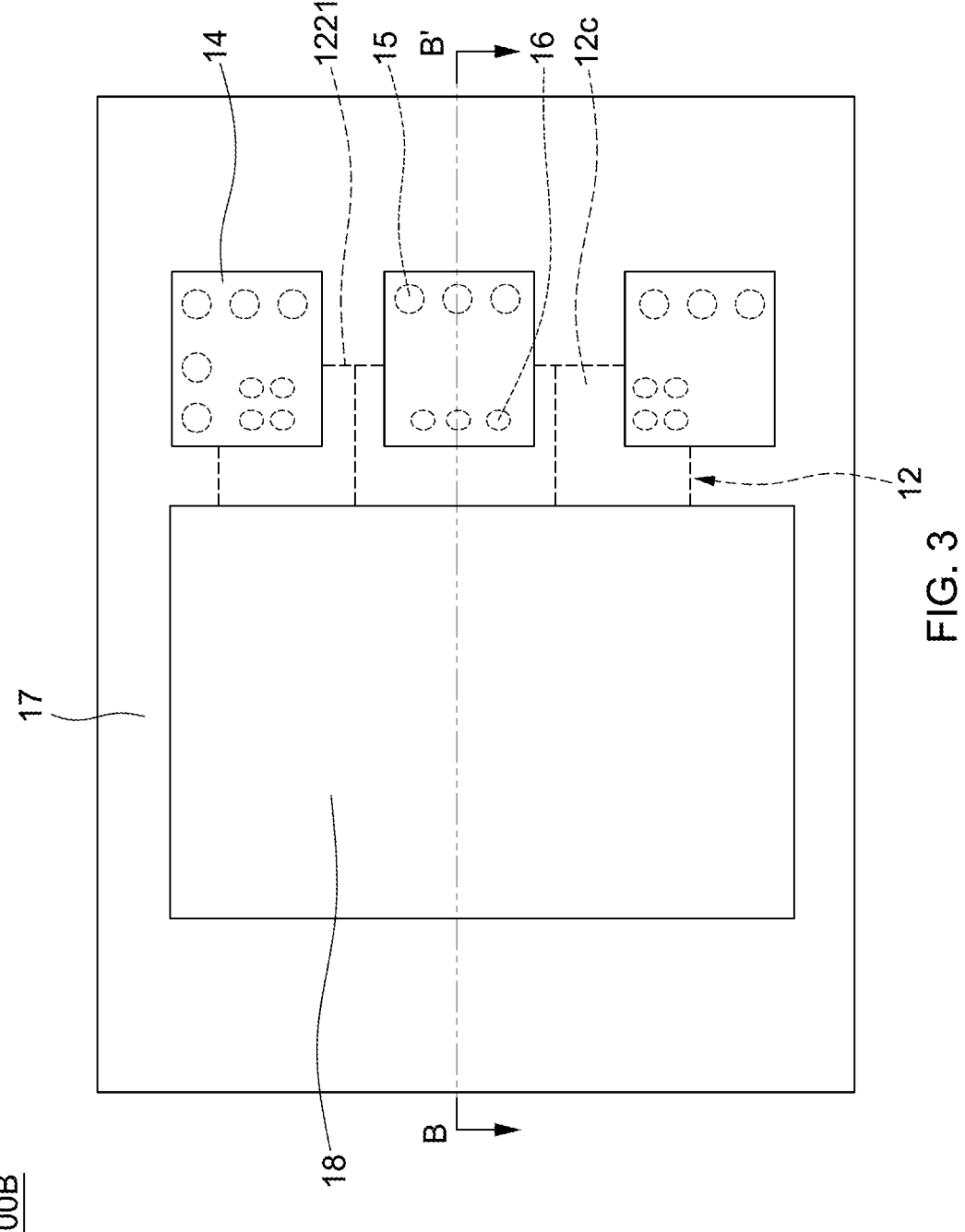
FIG. 3 illustrates a top view of an example of an electronic package according to some embodiments of the present disclosure.
Figure 4:
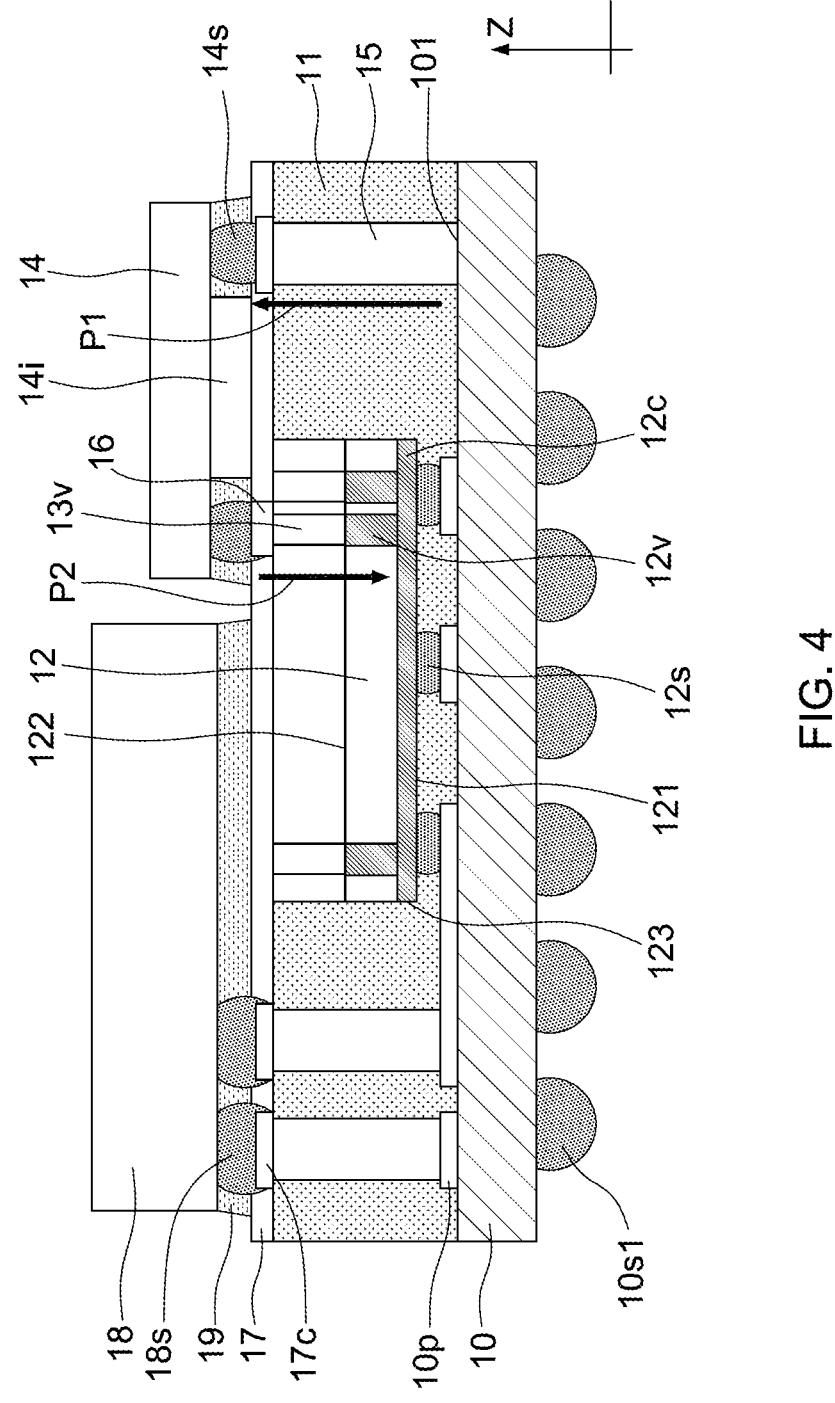
FIG. 4 illustrates a cross-sectional view along the line B-B' of the electronic package of FIG. 1 according to some embodiments of the present disclosure.

FIG. 3 illustrates a top view of an example of an electronic package 100B according to some embodiments of the present disclosure. FIG. 4 illustrates a cross-sectional view along the line B-B' of the electronic package 100B of FIG. 3 according to some embodiments of the present disclosure. The electronic package 100B is similar to the electronic package 100A in FIG. 1 and FIG. 2. Therefore, some detailed descriptions may refer to the corresponding paragraphs above and are not repeated hereinafter for conciseness. The difference therebetween will be discussed below.

The electronic package 100B may further include a memory device 18 disposed over the electronic component 12. The memory device 18 may be disposed on the backside surface 122 of the electronic component 12. The memory device 18 may be disposed adjacent to the power regulating components 14. The memory device 18 and the power regulating components 14 may be side-by-side. The memory chip 18 may expose a portion of the backside surface 122 of the electronic component 12. The memory chip 18 may cover at least one of the circuit regions 12c of the electronic component 12. The memory device 18 may partially overlap the backside surface 122 of the electronic component 12 in the direction Z. The memory device 18 may be configured to transmit an electrical signal or a power to the carrier 10 through a plurality of solder bumps 18$s$. The memory device 18 may be configured to transmit an electrical signal or a power to the electronic component 12 through a plurality of solder bumps 18$s$.

The inductor 14$i$ of the electronic package 100B may have a size smaller than that of the electronic package 100A. As such, the solder bumps 14$s$ may be in contact with the power regulating components 14. The electronic package 100B further includes a molding compound 19 disposed between the memory device 18 and the RDL 17 or between the power regulating components 14 and the RDL 17. The molding compound 19 surrounds the solder bumps 18$s$ and the solder bumps 14$s$.

Figure 5:
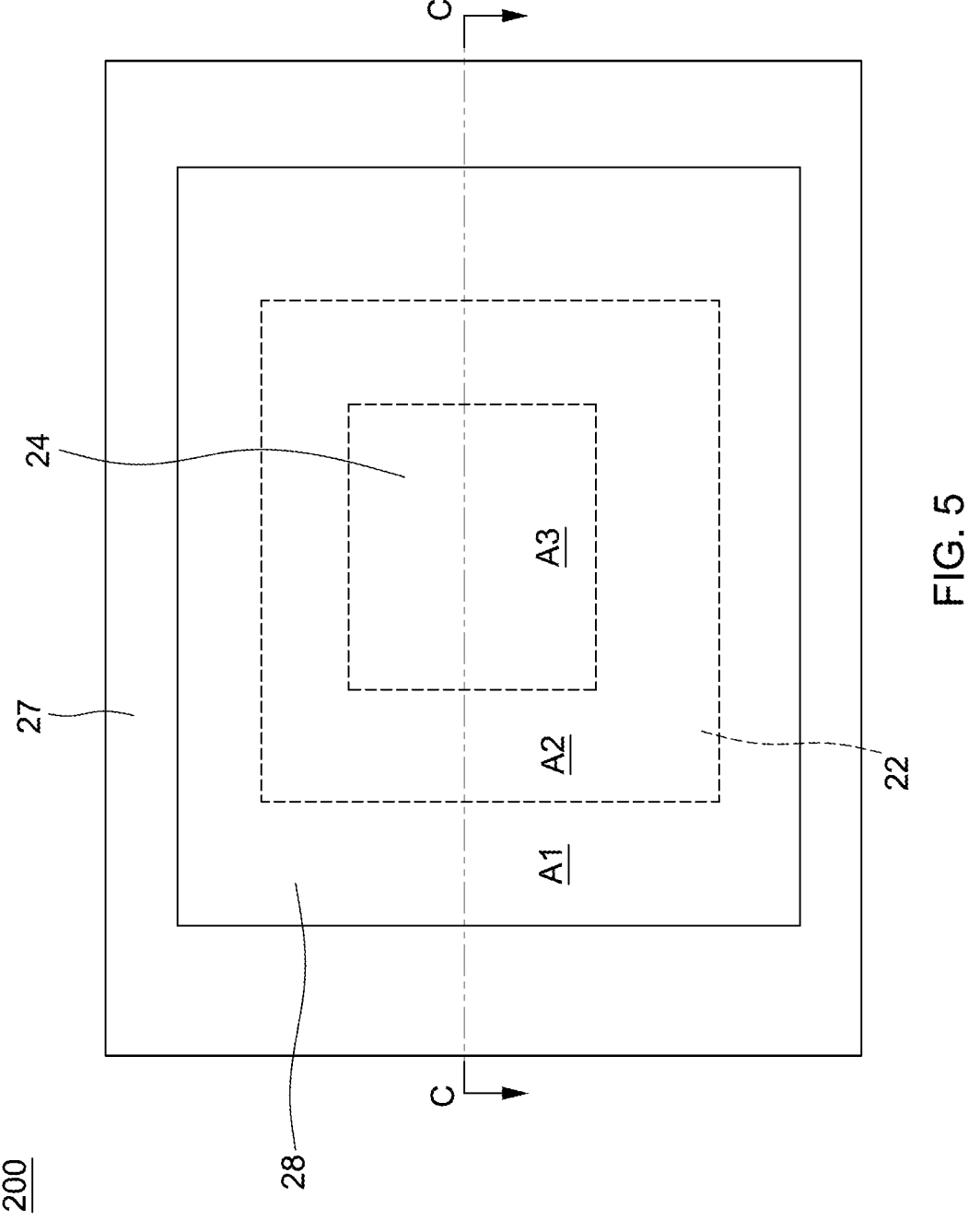
FIG. 5 illustrates a top view of an example of an electronic package according to some embodiments of the present disclosure.
Figure 6:
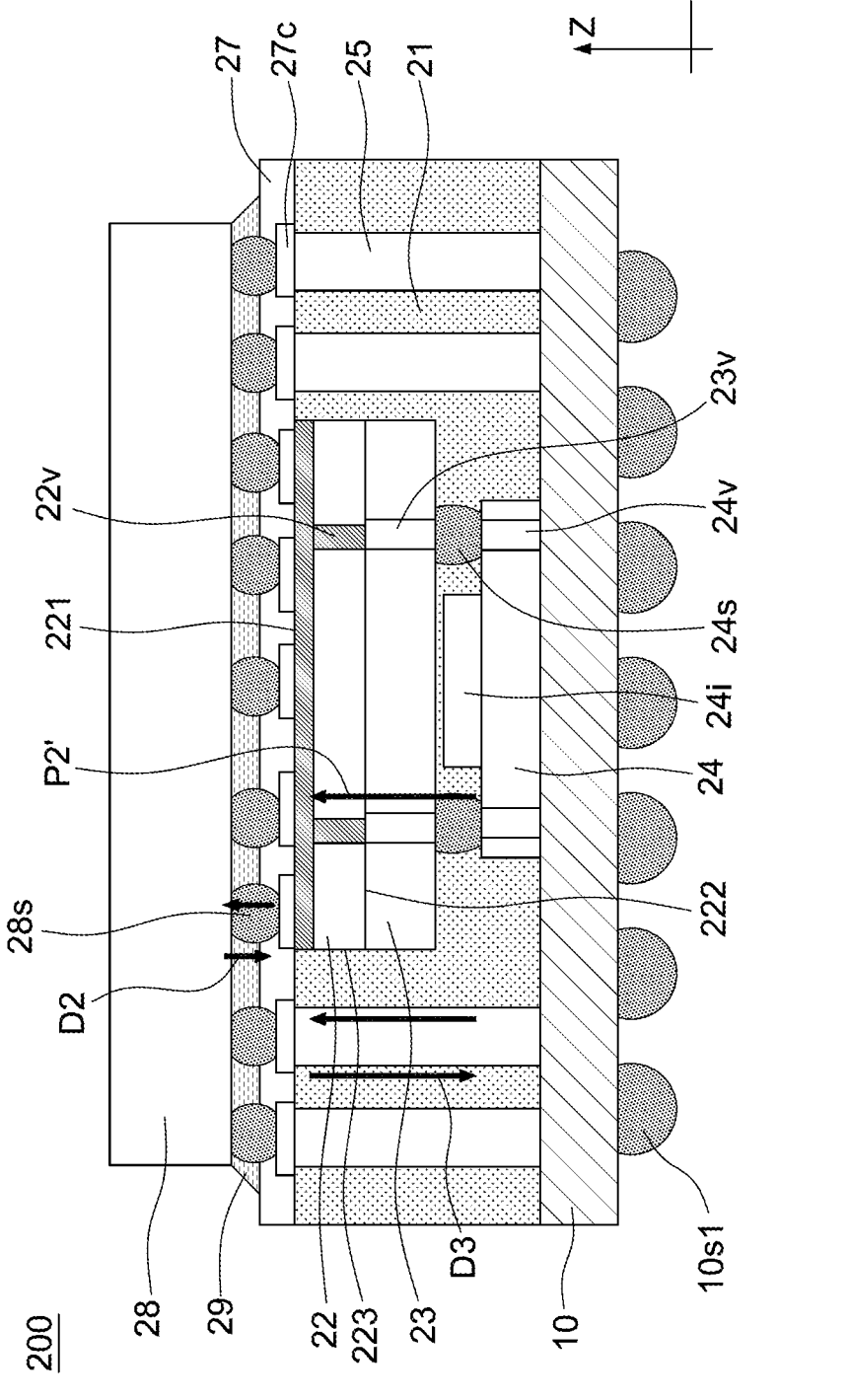
FIG. 6 illustrates a cross-sectional view along the line C-C' of the electronic package of FIG. 1 according to some embodiments of the present disclosure.

FIG. 5 illustrates a top view of an example of an electronic package 200 according to some embodiments of the present disclosure. FIG. 6 illustrates a cross-sectional view along the line C-C' of the electronic package 200 of FIG. 1 according to some embodiments of the present disclosure.

The electronic package 200 may include a carrier 10, an encapsulant 21, an electronic component 22, a passive device 23, and a power regulating component 24, a plurality of conductive elements 25, a redistribution layer (RDL) 27, and a memory device 28.

The encapsulant 21 of the electronic package 200 may be similar to the encapsulant 11 of the electronic package 100A. The electronic component 22 of the electronic package 200 may be similar to the electronic component 12 of the electronic package 100A. The passive device 23 of the electronic package 200 may be similar to the passive device 13 of the electronic package 100A. The power regulating component 24 of the electronic package 200 may be similar to one of the power regulating components 14 of the electronic package 100A. The conductive elements 25 of the electronic package 200 may be similar to the conductive elements 15 of the electronic package 100A. The RDL 27 of the electronic package 200 may be similar to the RDL 17 of the electronic package 100A. The memory device 28 of the electronic package 200 may be similar to the memory device 18 of the electronic package 100B.

As shown in FIG. 6, the power regulating component 24 is disposed on the surface 101 of the carrier 10. The power regulating component 24 may disposed between the carrier 10 and the passive device 23. The power regulating component 24 may include a conductive via 24$v$ electrically connected to the carrier 10. The power regulating component 24 may include solder bumps 24$s$ electrically connecting the power regulating component 24 and the passive device 23. The power regulating component 24 may receive a power from a power supply in the carrier 10 or outside of the carrier 10.

The passive device 23 may be disposed between the electronic component 22 and the power regulating component 24. The passive device 23 may include a conductive via 23$s$ electrically connected to the solder bumps 24$s$. The electronic component 22 may be disposed on the power regulating component 24. The electronic component 22 may have a backside surface 222 in contact with the passive device 23 and an active surface 221 opposite to the backside surface 222. The electronic component 22 may have a lateral surface 223 extending between the active surface 221 and the backside surface 222. The lateral surface 223 may be covered by the encapsulant 21.

The electronic component 22 may be disposed between the power regulating component 24 and the memory device 28. The electronic component 22 may include a circuit region 22$c$ within or adjacent to the active surface 221. The electronic component 22 may include a conductive via 22$v$ extending between the active surface 221 and the backside surface 222. The conductive via 22$v$ may electrically connect the backside surface 222 to the active surface 221. The conductive via 22$v$ may electrically connect the circuit region 22$c$ with the power regulating component 24. The active surface 221 of the electronic component 22 may be electrically connected to the power regulating component 24 through the conductive via 22$v$, the conductive via 23$v$ and/or the solder bumps 24$s$.

The power regulating component 24 may be electrically connected with the electronic component 22 through the conductive via 23$v$, the conductive via 22$v$, and the solder bumps 24$s$. In some embodiments, the power regulating component 24 may be configured to provide a power to the electronic component 22 (e.g., the circuit region 22$c$) through the backside surface (e.g., the surface 222). A power path P2' may be established between the power regulating component 24 and the electronic component 22 and pass through the backside surface 222 of the electronic component 22. The arrow of the denotation "P2'" shown in FIG. 6 indicates a power path established among the power regulating component 24, the solder bumps 24$s$ the conductive via 23$v$ of the passive device 23, the conductive via 22$v$, and the electronic component 22. In some embodiments, a portion of the power path P2' may pass through the passive device 23.

In some embodiments, the power from the power regulating component 24 may be transmitted to the electronic component 22 through the power path P2'. In some embodiments, the power path P2' may be configured to transmit a power from the power regulating component 24 to the electronic component 22.

The conductive elements 25 may be disposed on the surface 101 of the carrier 10. The conductive elements 25 may be surrounded by the encapsulant 21. The conductive elements 25 may surround the lateral surface 223 of the electronic component 22. The conductive elements 25 may electrically connect the carrier 10 and the memory device 28.

The memory device 28 may be disposed above the power regulating component 24. The memory device 28 may be disposed on the active surface 221 of the electronic component 22. The memory device 28 may overlap the power regulating component 24 in a direction Z substantially perpendicular to the surface 101 of the carrier 10 on which the power regulating component 24 is disposed. The memory device 28 may overlap the electronic component 22 in the direction Z. As shown in FIG. 5, the memory device 28 has a projecting area A1 on the surface 101 of the carrier 10 (refer to FIG. 6). The electronic component 22 has a projecting area A2 on the surface 101 of the carrier 10 (refer to FIG. 6). The power regulating component 24 has a projecting area A3 on the surface 101 of the carrier 10 (refer to FIG. 6). The projecting area A1 may cover the second projecting area A2. The projecting area A1 may cover the second projecting area A3. The projecting area A2 may cover the second projecting area A3. The size of the projecting area A1 may be greater than that of the project area A2. The size of the projecting area A2 may be greater than that of the project area A3.

In some embodiments, a non-power path (or a data signal path) D2 may be established between the memory device 28 and the electronic component 22 and pass through the active surface 221 of the electronic component 22. In some embodiments, one or more data signals may be transmitted between the memory device 28 and the electronic component 22 through the data signal path D2. A non-power path (or a data signal path) D3 may extend outside the electronic component 22 and to the memory device 28 along the lateral surface 223 of the electronic component 22. In some embodiments, one or more data signals may be transmitted between the memory device 28 and the carrier 10 through the data signal path D3.

The memory device 28 may be configured to transmit a data signal to the carrier 10 through the conductive elements 25. The conductive elements 25 may be adjacent to the electronic component 22 and spaced apart from the electronic component 22. The memory device 28 may be configured to receive a power from the carrier 10 through the conductive elements 25. The memory device 28 may be configured to transmit a data signal to the electronic component 22 through a plurality of solder bumps 28s.

According to some embodiments of the present disclosure, by stacking the power regulating component 24, the electronic component 22, and the memory device 28, the size of the electronic package 200 can be relatively small. Furthermore, the power regulating component 24 can provide a power to the electronic component 22 from its backside surface 221, such that the voltage drop in the power path (e.g., the power path P2') can be significantly lower than that in the power path for any power regulating component which is mounted on the surfaces 101 and/or 102 of the carrier 10.

Figure 7:
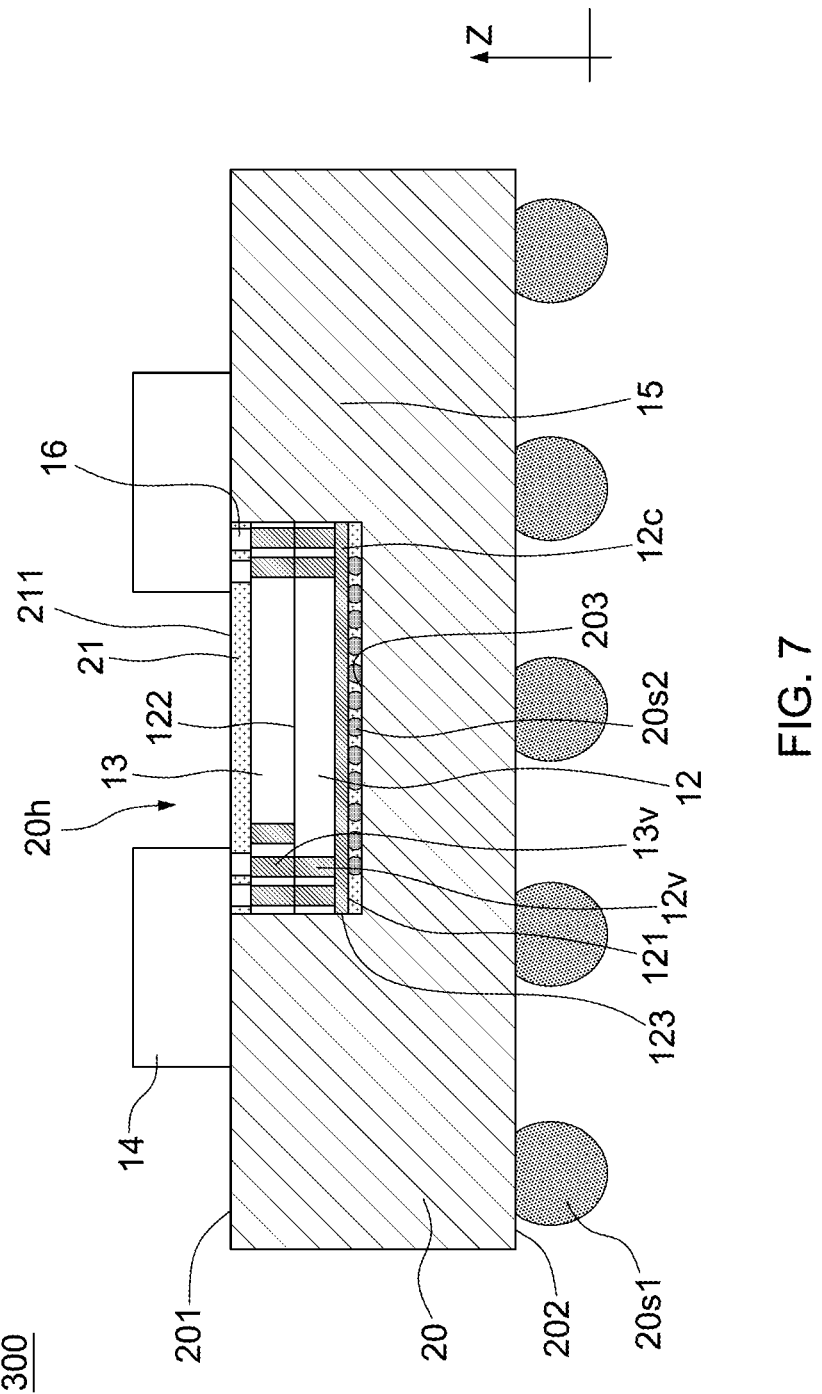
FIG. 7 illustrates a cross-sectional view of an electronic package according to some embodiments of the present disclosure.

FIG. 7 illustrates a cross-sectional view of an electronic package 300 according to some embodiments of the present disclosure. The electronic package 300 is similar to the electronic package 100A in FIG. 1 and FIG. 2. Therefore, some detailed descriptions may refer to the corresponding paragraphs above and are not repeated hereinafter for conciseness. The difference therebetween will be discussed below.

The electronic package 300 may include a carrier 20. In some embodiments, the carrier 20 may include, for example, a printed circuit board (PCB), such as a paper-based copper foil laminate, a composite copper foil laminate, or a polymer-impregnated glass-fiber-based copper foil laminate. In some embodiments, the carrier 20 may include a semiconductor substrate including silicon, germanium, or other suitable materials. In some embodiments, the carrier 20 may include a redistribution layer (RDL) (not shown) disposed within or on the carrier 20. The RDL of the carrier 20 may provide a fan-out horizontal electrical path for the carrier 20.

The carrier 20 may include a surface 201 and a surface 202 opposite to the surface 201. The carrier 20 may include one or more conductive pads (not shown) in proximity to, adjacent to, or embedded in and exposed from the surface 201 and/or 202 of the carrier 20. The carrier 20 may include a solder bump 20s1 on the surface 202 of the carrier 20 for electrical connections with an external device.

The carrier 20 may define a cavity 20h for accommodating the electronic component 12 and the passive device 13. The carrier 20 may has a surface 203 within the cavity 20h. The surface 203 may be located between the surface 201 and the surface 202 of the carrier 20. The carrier 20 may include a solder bump 20s2 on the surface 203 of the carrier 20 for electrical connections, including, for example, the power routing path (or the power path) and the signal routing path (or the signal path) in the electronic package 300.

In some embodiments, the encapsulant 21 may have a surface 211. The surface 211 of the encapsulant 21 and the surface 201 of the carrier 20 may be substantially coplanar. The encapsulant 21 may be formed on the passive device 13 after the electronic component 12 is attached to or bonded on the surface 203 of the carrier 20. The overall height of the electronic package 300 is determined mainly by the carrier 20. Therefore, the overall height of the electronic package 300 may be relatively short.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to $\pm10\%$ of that numerical value, such as less than or equal to $\pm5\%$, less than or equal to $\pm4\%$, less than or equal to $\pm3\%$, less than or equal to $\pm2\%$, less than or equal to $\pm1\%$, less than or equal to $\pm0.5\%$, less than or equal to $\pm0.1\%$, or less than or equal to $\pm0.05\%$. For example, two numerical values can be deemed to be "substantially" the same or equal if a difference between the values is less than or equal to $\pm10\%$ of an average of the values, such as less than or equal to $\pm5\%$, less than or equal to $\pm4\%$, less than or equal to $\pm3\%$, less than or equal to $\pm2\%$, less than or equal to $\pm1\%$, less than or equal to $\pm0.5\%$, less than or equal to $\pm0.1\%$, or less than or equal to $\pm0.05\%$.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic package, comprising:
an electronic component having an active surface and a backside surface opposite to the active surface; and
a plurality of power regulating components comprising a first power regulating component and a second power regulating component, wherein the backside surface of the electronic component is located between the active surface of the electronic component and the first power regulating component; and
a capacitor disposed between the backside surface of the electronic component and the first power regulating component, wherein the electronic component comprises a plurality of first conductive vias exposed by the backside surface, and the capacitor comprises a plurality of second conductive vias in direct contact with the first conductive vias,
wherein a first power path is established from the first power regulating component to the backside surface of the electronic component,
wherein a second power path is established from the second power regulating component to the backside surface of the electronic component, and
wherein a plurality of different powers are transmitted, through the backside surface of the electronic component, to a plurality of circuit regions adjacent to the active surface of the electronic component.

2. The electronic package of claim 1, further comprising a carrier disposed below the electronic component, wherein the power regulating components are configured to receive a plurality of first powers from the carrier along a lateral surface of the electronic component and provide the plurality of different powers to the electronic component.

3. The electronic package of claim 1, wherein the plurality of circuit regions is closer to the active surface of the electronic component than to the backside surface of the electronic component, and each of the plurality of circuit regions is configured to be powered by a corresponding one of the plurality of power regulating components, without consuming input/output (I/O) pins on the active surface of the electronic component.

4. The electronic package of claim 1, wherein the capacitor is a discrete component located outside the electronic component and comprises a deep trench capacitor.

5. The electronic package of claim 1, further comprising:
a redistribution layer (RDL) disposed between the capacitor and the first power regulating component;
a plurality of inductor devices electrically connected with the RDL and included in the plurality of power regulating components; and
a plurality of solder bumps disposed on the inductor devices.

6. The electronic package of claim 5, wherein the RDL includes a first side electrically connected with the plurality of solder bumps and a second side electrically connected with the second conductive vias.

7. The electronic package of claim 1, further comprising a carrier disposed below the power regulating components, wherein the electronic component and the capacitor are disposed in a cavity of the carrier and contact an inner lateral surface of the carrier, wherein the cavity has an opening facing the power regulating components.

8. The electronic package of claim 7, wherein the carrier has a surface within the cavity, wherein the electronic component is closer to the surface than the capacitor is.

9. The electronic package of claim 8, wherein the carrier comprises a plurality of solder bumps on the surface of the carrier for electrical connections including a power routing path and a signal routing path.

10. The electronic package of claim 7, further comprising:
an encapsulant encapsulating the electronic component and the capacitor and disposed in the cavity, wherein an upper surface of the encapsulant and an upper surface of the carrier are substantially coplanar.

11. The electronic package of claim 10, further comprising:
a plurality of conductive elements surrounded by the encapsulant and disposed on the backside of the electronic component.

12. The electronic package of claim 1, wherein the plurality of power regulating components are not overlapped in a direction substantially perpendicular to the backside surface of the electronic component, and the first power regulating component has an overhang structure extending from the electronic component, and the overhang structure is configured to receive a power along a lateral surface of the electronic component, regulate the power, and provide a regulated power to the electronic component.

13. The electronic package of claim 7, wherein the power regulating components have a plurality of overhang structures surrounding the cavity.

14. An electronic package, comprising:
a power regulating component;
a memory device disposed above the power regulating component;
an electronic component disposed between the power regulating component and the memory device, wherein the electronic component has an active surface and a backside surface opposite to the active surface, and the backside surface of the electronic component is disposed between the active surface of the electronic component and the power regulating component; and
a capacitor disposed between the backside surface of the electronic component and the power regulating component, wherein the electronic component comprises a plurality of first conductive vias exposed by the backside surface, and the capacitor comprises a plurality of second conductive vias in direct contact with the first conductive vias,
wherein a plurality of power paths are established between the power regulating component and the electronic component and passes through the backside surface of the electronic component, and wherein a plurality of different powers are transmitted, through the backside surface of the electronic component, to a plurality of circuit regions adjacent to the active surface of the electronic component.

15. The electronic package of claim 14, wherein the electronic component includes a circuit region closer to the active surface of the electronic component than to the backside surface of the electronic component, and each of the plurality of circuit regions is configured to be powered by the power regulating component, without consuming input/output (I/O) pins on the active surface of the electronic component.

16. The electronic package of claim 14, further comprising:

an inductor device and a resistive device disposed between the capacitor and the power regulating component; and an encapsulant encapsulating the electronic component and the power regulating component, wherein a portion of the encapsulant is disposed between the capacitor and the inductor device.

17. The electronic package of claim 14, further comprising a carrier disposed below the electronic component, wherein the power regulating component is configured to receive a plurality of first powers from the carrier and provide the plurality of different powers to the electronic component.

18. An electronic package, comprising:

an electronic component having a first edge;

a redistribution layer (RDL) disposed over the electronic component;

a capacitor disposed between the RDL and the electronic component, wherein the electronic component comprises a plurality of first conductive vias exposed by a backside surface of the electronic component, and the capacitor comprises a plurality of second conductive vias in direct contact with the first conductive vias; and a plurality of power regulating components disposed over the RDL and comprising a first power regulating component and a second power regulating component, wherein each of the first power regulating component and the second power regulating component at least partially overlaps the first edge of the electronic component from a top view, and wherein a plurality of different powers are transmitted, through the backside surface of the electronic component, to a plurality of circuit regions adjacent to an active surface of the electronic component.

19. The electronic package of claim 18, further comprising a carrier disposed below the electronic component, wherein the power regulating components are configured to receive a plurality of first powers from the carrier along a lateral surface of the electronic component and provide the plurality of different powers to the electronic component.

20. The electronic package of claim 18, wherein the plurality of circuit regions is closer to an active surface of the electronic component than to the backside surface of the electronic component, and each of the plurality of circuit regions is configured to be powered by a corresponding one of the plurality of power regulating components, without consuming input/output (I/O) pins on the active surface of the electronic component.

* * * * *